United States Patent
Soga et al.

(10) Patent No.: US 11,069,634 B2
(45) Date of Patent: Jul. 20, 2021

(54) AMPLIFIER AND AMPLIFICATION APPARATUS

(71) Applicant: FUJITSU LIMITED, Kawasaki (JP)

(72) Inventors: Ikuo Soga, Isehara (JP); Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 95 days.

(21) Appl. No.: 16/662,107

(22) Filed: Oct. 24, 2019

(65) Prior Publication Data

US 2020/0161258 A1     May 21, 2020

(30) Foreign Application Priority Data

Nov. 19, 2018   (JP) .............................. JP2018-216302

(51) Int. Cl.
*H03F 3/14*        (2006.01)
*H01L 23/66*       (2006.01)
(Continued)

(52) U.S. Cl.
CPC .......... *H01L 23/66* (2013.01); *H01L 23/3114* (2013.01); *H01L 23/3128* (2013.01); *H01L 23/3135* (2013.01); *H01L 23/49816* (2013.01); *H01L 23/49822* (2013.01); *H01L 23/49838* (2013.01); *H01L 24/05* (2013.01);
(Continued)

(58) Field of Classification Search
CPC ..... H01L 23/66; H01L 24/05; H01L 29/2003; H01L 23/3128; H01L 24/20; H01L 23/49838; H01L 23/49822; H01L 23/49816; H01L 23/3114; H01L 23/3135; H01L 2924/1423; H01L 2223/6655; H01L 2924/30111; H01L 2924/1033;
H01L 2924/1306; H01L 2223/6683; H01L 23/36; H01L 23/3107; H01L 24/16; H01L 24/32; H01L 24/73; H01L 24/92; H01L 2924/1421; H01L 2924/351; H01L 2224/16227; H01L 2224/32225; H01L 2224/73204; H01L 2224/92125; H01L 2924/18162; H01L 2224/12105; H01L 2224/04105; H01L 2224/16225;
(Continued)

(56) References Cited

U.S. PATENT DOCUMENTS 7,067,911 B1 *  6/2006  Lin ................... H01L 23/49811
                                                       257/686
2008/0012097 A1  1/2008  Takahashi et al.

FOREIGN PATENT DOCUMENTS

JP       10-209774     8/1998
JP       2008-21789    1/2008

* cited by examiner

*Primary Examiner* — Khanh V Nguyen
(74) *Attorney, Agent, or Firm* — Fujitsu Patent Center

(57) ABSTRACT

An amplifier includes an amplifier circuit configured to include a transistor that amplifies a signal, an insulating film provided over the amplifier circuit, an input pad provided over the insulating film and coupled to the transistor through a wiring in the insulating film, an output pad provided over the insulating film and coupled to the transistor through the wiring in the insulating film, and a metal layer provided over the insulating film to be grounded, and configured to include an opening that extends in a second direction intersecting with a first direction in a plane direction, the signal propagating from the input pad to the output pad in the first direction, and the opening being at a position overlapping the transistor.

11 Claims, 7 Drawing Sheets

(51) Int. Cl.
  *H01L 23/00* (2006.01)
  *H01L 29/20* (2006.01)
  *H01L 23/31* (2006.01)
  *H01L 23/498* (2006.01)
  *H03F 3/213* (2006.01)

(52) U.S. Cl.
  CPC .......... *H01L 24/20* (2013.01); *H01L 29/2003* (2013.01); *H03F 3/213* (2013.01); *H01L 2223/6655* (2013.01); *H01L 2223/6683* (2013.01); *H01L 2924/1033* (2013.01); *H01L 2924/1306* (2013.01); *H01L 2924/1423* (2013.01); *H01L 2924/30111* (2013.01); *H03F 2200/222* (2013.01); *H03F 2200/387* (2013.01); *H03F 2200/451* (2013.01)

(58) Field of Classification Search
  CPC ................. H01L 2924/00; H03F 3/213; H03F 2200/222; H03F 2200/387; H03F 2200/451
  See application file for complete search history.

AMPLIFIER AND AMPLIFICATION APPARATUS

CROSS-REFERENCE TO RELATED APPLICATION

This application is based upon and claims the benefit of the prior Japanese Patent Application No. 2018-216302, filed on Nov. 19, 2018, the entire contents of which are incorporated herein by reference.

FIELD

The present disclosure relates to an amplifier and an amplification apparatus.

BACKGROUND

In an amplifier in which a transistor chip is accommodated in a metal package, it is known to provide a slit in an upper cover of the metal package in order to suppress unnecessary oscillation caused by a current transmitted to the metal package (see, e.g., Japanese Laid-open Patent Publication No. 10-209774). In addition, in order to suppress the fluctuation of an inductance value of an inductor formed on a first conductive layer on a semiconductor substrate, it is known to provide a slit in a second conductive layer positioned above the first conductive layer (see, e.g., Japanese Laid-open Patent Publication No. 2008-021789).

Related techniques are disclosed in, for example, Japanese Laid-open Patent Publication Nos. 10-209774 and 2008-021789.

SUMMARY

According to an aspect of the embodiments, an amplifier includes an amplifier circuit configured to include a transistor that amplifies a signal, an insulating film provided over the amplifier circuit, an input pad provided over the insulating film and coupled to the transistor through a wiring in the insulating film, an output pad provided over the insulating film and coupled to the transistor through the wiring in the insulating film, and a metal layer provided over the insulating film to be grounded, and configured to include an opening that extends in a second direction intersecting with a first direction in a plane direction, the signal propagating from the input pad to the output pad in the first direction, and the opening being at a position overlapping the transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

It is conceivable that an amplifier including an amplifier chip having a transistor that amplifies a high-frequency signal and an insulating film provided on the amplifier chip is flip-chip mounted on a mounting substrate using a pad provided on the insulating film. In this case, in order to suppress the capacitive coupling between the mounting substrate and the amplifier chip, a grounded metal layer may be provided on the insulating film. However, it has been found that good amplification characteristics may not be obtained in such an amplification apparatus.

Hereinafter, an embodiment of a technique that makes it possible to improve amplification characteristics.

First Embodiment

Figure 1A:
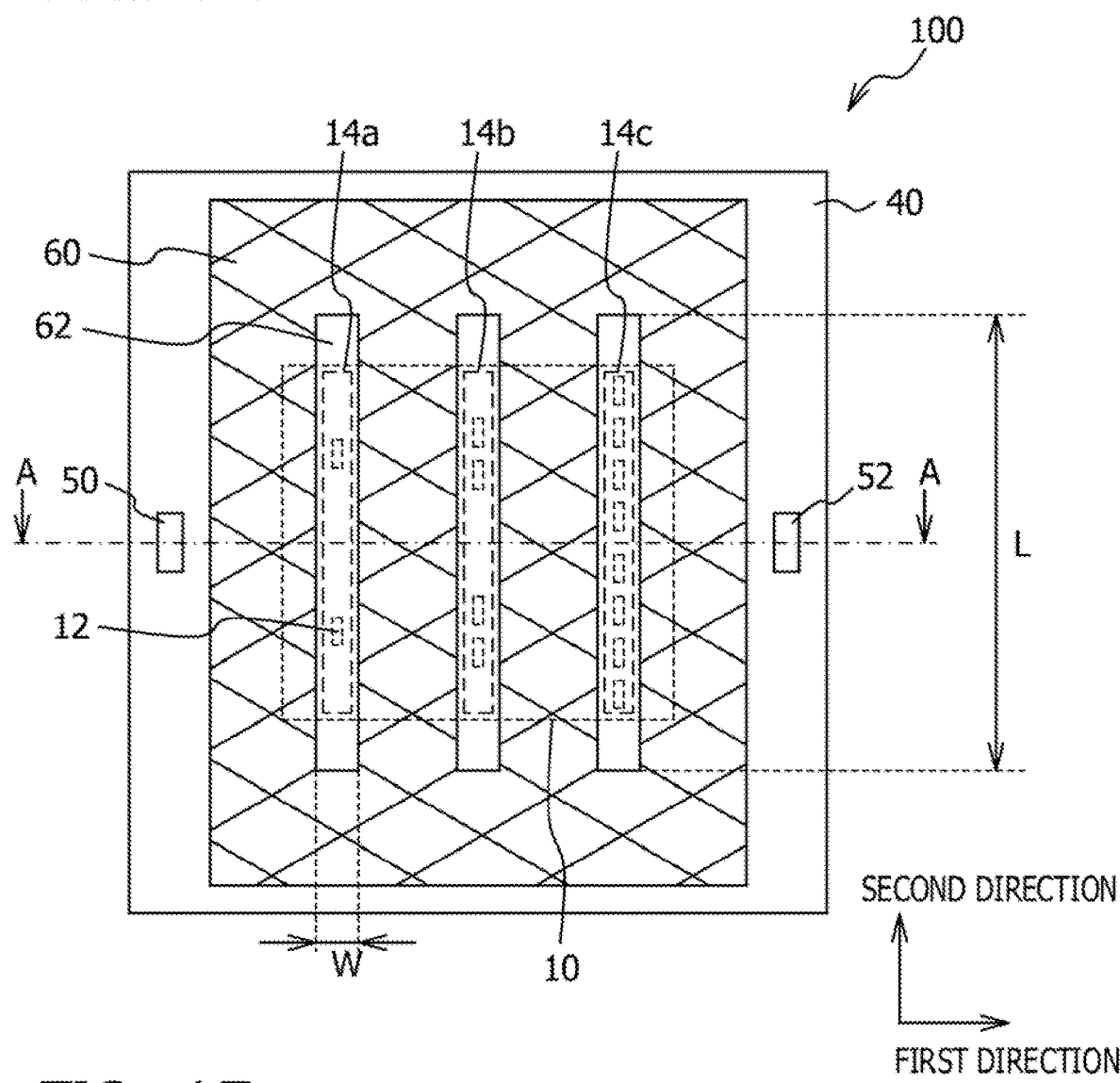
FIG. 1A is a plan view illustrating an amplifier according to a first embodiment.
Figure 1B:
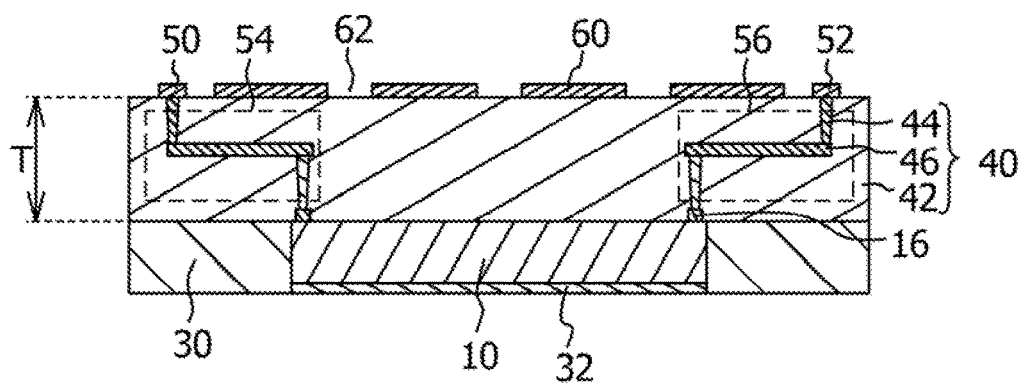
FIG. 1B is a cross-sectional view taken along line A-A in FIG. 1A.

FIG. 1A is a plan view illustrating an amplifier according to a first embodiment, and FIG. 1B is a cross-sectional view taken along line A-A in FIG. 1A. In FIG. 1A, a ground plate 60 is hatched for the sake of clarity of the drawing. As illustrated in FIGS. 1A and 1B, an amplifier 100 of the first embodiment is a fan out wafer level package (FOWLP) amplifier including an amplifier chip 10, a resin layer 30, and a redistribution layer 40.

The amplifier chip 10 is, for example, a monolithic microwave integrated circuit (MMIC), and is formed with, for example, a transistor 12 which amplifies a high-frequency signal. In the first embodiment, descriptions will be made on an exemplary case where three transistor areas 14a to 14c are provided and transistors 12 formed in the respective transistor areas 14a to 14c are connected in three tiers. The frequency of the high-frequency signal is, for example, microwave or millimeter-wave of 1 GHz to 100 GHz, as an example, 10 GHz to 50 GHz.

Each of the transistors 12 is, for example, a high-power transistor capable of performing a high-current operation at a high voltage, and, as an example, is a high electron mobility transistor using gallium nitride. The transistors 12 may be field effect transistors using materials other than gallium nitride, or may be other type of transistors ones such as bipolar transistors.

The amplifier chip 10 is embedded in the resin layer 30. That is, the amplifier chip 10 is surrounded by the resin layer 30 such that the resin layer 30 is provided to cover the side surface of the amplifier chip 10 on the side of the amplifier chip 10. A pad 16 of the amplifier chip 10 is exposed from the resin layer 30 on one surface side of the resin layer 30. The pad 16 is used for electrical connection between the transistor 12 and the outside of the amplifier chip 10. A metal film 32, which is in contact with the amplifier chip 10 to cover the amplifier chip 10, is provided on the other surface side of the resin layer 30. The metal film 32 functions as, for example, a heat spreader. As a result, even when the transistors 12 are high-power transistors and the amount of heat generation is large, the heat radiation to the heat radiating plate or the like through the metal film 32 is promoted, and thus, the characteristic deterioration due to the heat generation may be suppressed. For the resin layer 30, a thermosetting resin, a thermoplastic resin, an ultraviolet curable resin, or the like is used. The resin layer 30 may contain a filler such as silicon oxide, aluminum oxide, or silicon nitride. The metal film 32 is formed of, for example, a metal having a high thermal conductivity such as copper or aluminum.

The redistribution layer 40 is provided on the amplifier chip 10 and the resin layer 30 on the side where the pad 16 of the amplifier chip 10 is exposed from the resin layer 30. The redistribution layer 40 includes an insulating film 42, a redistribution via 44 that is provided in the insulating film 42 and extends in the thickness direction of the redistribution layer 40, and a redistribution 46 that is provided in the insulating film 42 and extends in a direction intersecting the redistribution via 44. For the insulating film 42, a resin material such as epoxy, polyimide, or polybenzoxazole is used. For the redistribution via 44 and the redistribution 46, a conductive material such as copper or aluminum is used.

An input pad 50 and an output pad 52 of the amplifier 100 are provided on the redistribution 46 of the re-outer layer of the redistribution layer 40 (that is, the redistribution 46 on the surface of the redistribution layer 40). The high-frequency signal is input from the input pad 50 through the redistribution via 44 and the redistribution 46 to the transistor 12 formed in the transistor area 14a of the amplifier chip 10 and amplified. The high-frequency signal is amplified by the transistor 12 in the transistor area 14a. Then, the high-frequency signal is sequentially input to the transistor 12 formed in the transistor area 14b and the transistor 12 formed in the transistor area 14c through the wiring formed in the amplifier chip 10, and amplified. The high-frequency signal amplified by the transistor 12 in the transistor area 14c is output to the outside from the pad 52 through the redistribution via 44 and the redistribution 46.

An input matching circuit 54 that performs an impedance matching of the high-frequency signal input to the transistor 12 in the transistor area 14a is formed using the redistribution 46 that connects between the input pad 50 and the pad 16 of the amplifier chip 10. An output matching circuit 56 that performs an impedance matching of the high-frequency signal output from the transistor 12 in the transistor area 14c is formed using the redistribution 46 that connects between the output pad 52 and the pad 16 of the amplifier chip 10. That is, the input matching circuit 54 and the output matching circuit 56 are formed in the redistribution layer 40.

An inter-tier matching circuit that performs an impedance matching of high-frequency signals between the transistors 12 in the transistor areas 14a and 14b is formed in the amplifier chip 10 using a wire that connects the transistors 12 in the respective areas. Similarly, an inter-tier matching circuit that performs an impedance matching of high-frequency signals between the transistors 12 in the transistor areas 14b and 14c is formed in the amplifier chip 10 using a wire that connects the transistors 12 in the respective areas.

Figure 2A:
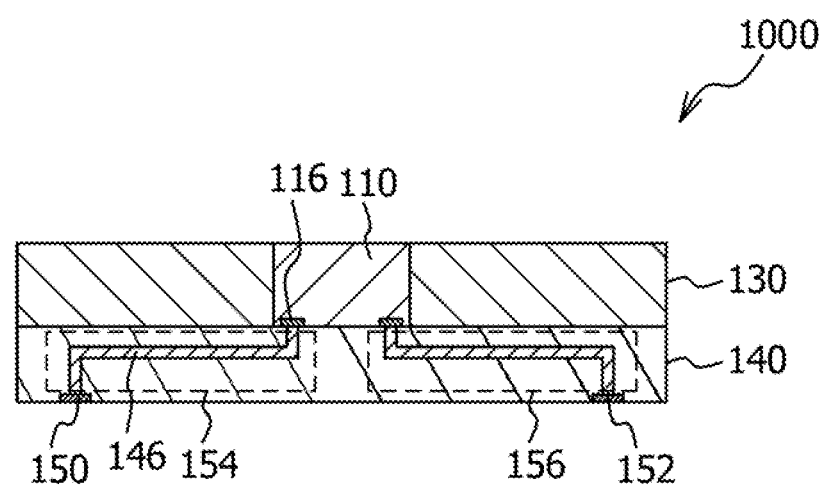
FIG. 2A is a cross-sectional view illustrating a fan out wafer level package (FOWLP) amplifier.
Figure 2B:
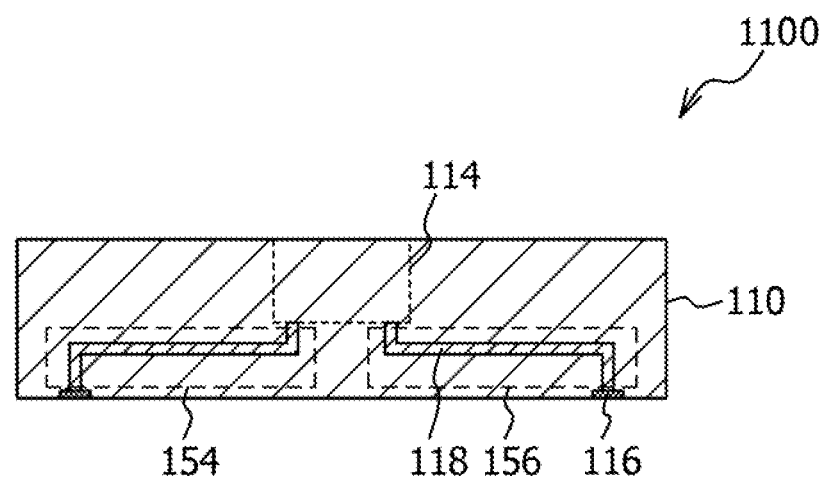
FIG. 2B is a cross-sectional view illustrating a chip size package (CSP) amplifier.

Here, advantages of using a FOWLP amplifier as the amplifier 100 of the first embodiment will be described. FIG. 2A is a cross-sectional view illustrating a fan out wafer level package (FOWLP) amplifier, and FIG. 2B is a cross-sectional view illustrating a chip size package CSP amplifier. As illustrated in FIG. 2A, a FOWLP amplifier 1000 includes an amplifier chip 110, a resin layer 130, and a redistribution layer 140. An input matching circuit 154 that performs an impedance matching of the high-frequency signal input to the amplifier chip 110 is formed using a redistribution 146 that connects between an input pad 150 and a pad 116 of the amplifier chip 110. An output matching circuit 156 that performs impedance matching of the high-frequency signal output from the amplifier chip 110 is formed using the redistribution 146 that connects between an output pad 152 and the pad 116 of the amplifier chip 110.

As illustrated in FIG. 2B, as compared with the FOWLP amplifier 1000, a CSP amplifier 1100 does not include the resin layer 130 and the redistribution layer 140, Therefore, the input matching circuit 154 and the output matching circuit 156 are formed using a wire 118 that connects a transistor area 114 of the amplifier chip 110 and the pad 116.

In the CSP amplifier 1100, the input matching circuit 154 and the output matching circuit 156 are formed in the amplifier chip 110. The matching circuit has a size determined by the wavelength band of the signal to be amplified. Therefore, when the matching circuit is formed in the amplifier chip 110, it is difficult to miniaturize the amplifier chip 110, and as a result, it is difficult to miniaturize the semiconductor substrate that constitutes the amplifier chip 110. Since an expensive semiconductor substrate such as, for example, a gallium nitride (GaN) substrate may be used as the semiconductor substrate, it is difficult to reduce the cost when it is difficult to miniaturize the amplifier chip 110.

Meanwhile, in the FOWLP amplifier 1000, although the transistor is formed in the amplifier chip 110, the input matching circuit 154 and the output matching circuit 156 may be formed in the redistribution layer 140, Therefore, the amplifier chip 110 may be miniaturized, and, as a result, the semiconductor substrate that constitutes the amplifier chip 110 may be miniaturized. In this manner, the cost may be reduced by using the FOWLP amplifier as the amplifier 100 of the first embodiment.

As illustrated in FIGS. 1A and 1B, the ground plate 60, which is a grounded metal layer, is provided on the surface of the redistribution layer 40. The ground plate 60 is positioned above the amplifier chip 10 and is provided on the redistribution layer 40 so as to be overlapped with the amplifier chip 10 and cover the amplifier chip 10. The ground plate 60 has an outer shape larger than the amplifier chip 10 in plan view. The ground plate 60 is formed of, for example, the same metal material as that of the redistribution via 44 and the redistribution 46 of the redistribution layer 46L The ground plate 60 is provided, for example, on the same plane as the input pad 50 and the output pad 52. The ground plate 60 may be provided inside the redistribution layer 40 as long as it is positioned above the amplifier chip 10 and provided on the redistribution layer 40 so as to be overlapped with the amplifier chip 10. In addition, the ground plate 60 may be formed of a metal material different from that of the redistribution via 44 and the redistribution 46.

One or a plurality of openings 62 are formed in the ground plate 60. The opening 62 is provided corresponding to the transistor areas 14a to 14c, That is, the opening 62 is provided at a position overlapping the transistor 12 formed in the transistor areas 14a to 14c. In other words, the opening 62 of the ground plate 60 is positioned immediately above the transistor 12 formed in the transistor areas 14a to 14c, so that the ground plate 60 itself is not positioned above the transistor 12. The opening 62 is, for example, larger than the area where the transistor 12 is formed, and provided to be overlapped with the entire transistor 12. The openings 62 corresponding to the transistor areas 14a to 14c, respectively, are provided, for example, to be overlapped with all of the plurality of transistors 12 formed in the transistor areas 14a to 14c, respectively. That is, one opening 62 is provided to be overlapped with a plurality of transistors 12. The opening 62 may be provided to be overlapped with a portion of the transistor 12.

Here, in the plan view of the amplifier 100, a signal direction in which a high-frequency signal is propagated from the input pad 50 toward the output pad 52 is referred to as a "first direction," and a direction (e.g., orthogonal direction) intersecting with the first direction in the plane direction is referred to as a "second direction," The opening 62 has a shape that extends in the second direction. For example, the opening 62 is shaped to be longer in the second direction than in the first direction. The opening 62 has, for example, a rectangular shape, but may have different shape such as an elliptical shape. Although descriptions have been made on the case where the plurality of transistors 12 are formed in the transistor areas 14a to 14c as an example, there may be an area where only one transistor 12 is formed. Even in this case, the opening 62 has a shape that extends in the second direction, for example, a shape longer in the second direction than in the first direction.

The length L of the opening 62 in the second direction is larger than $\lambda/2$ (i.e., $L>\lambda/2$) where $\lambda$ is the wavelength at the lower limit frequency of the frequency band in which gain is obtained by the amplifier 10. The lower limit frequency of the frequency band in which gain is obtained is a frequency on the low frequency side when the gain is 0 dB in the amplification characteristic of the amplifier chip 10 in the bare chip state in FIG. 4 described later. The width W of the opening 62 in the first direction is larger than the thickness T of the insulating film 42 from the surface of the amplifier chip 10 to the ground plate 60.

Figure 3A:
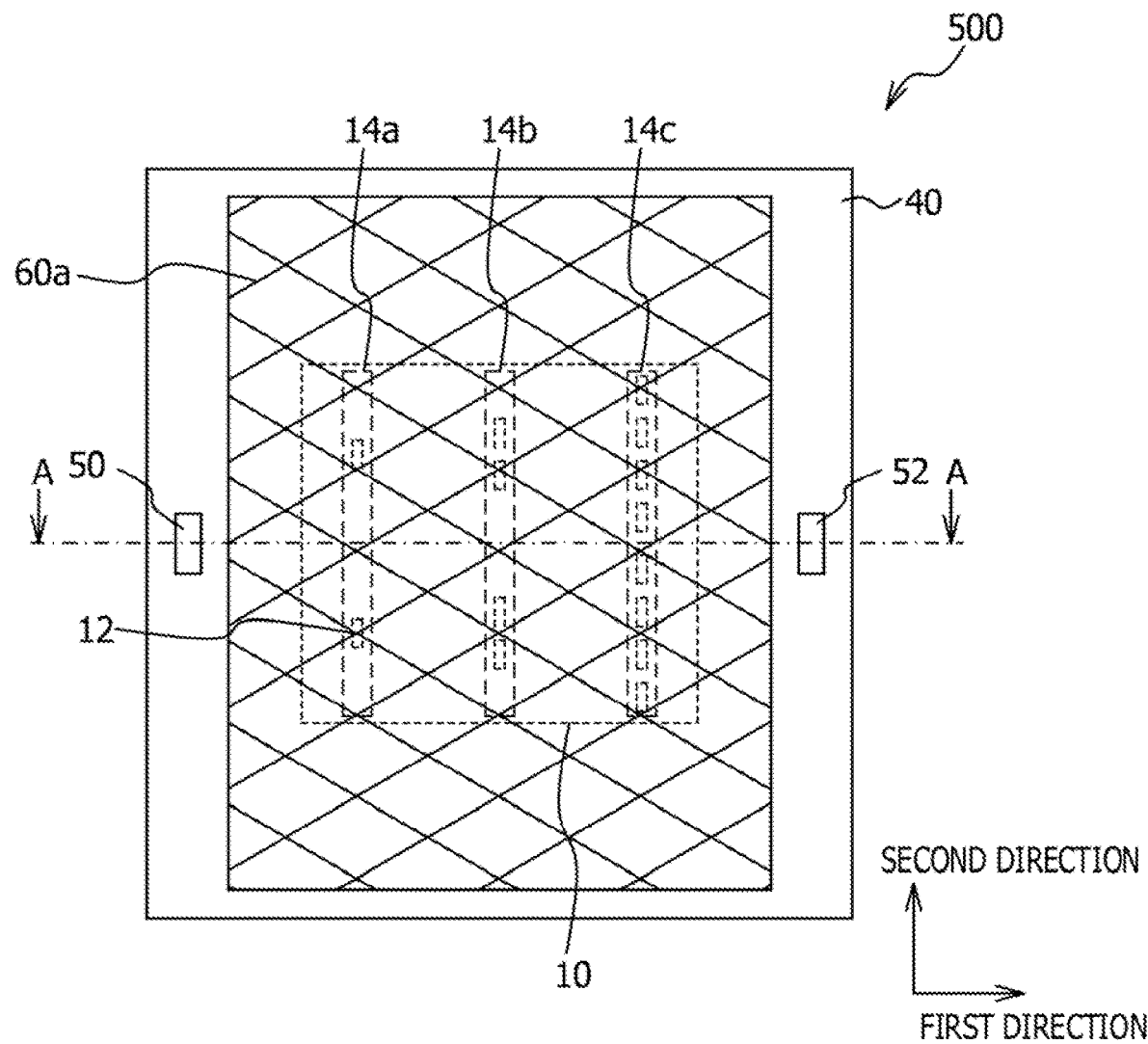
FIG. 3A is a plan view illustrating an amplifier according to a first comparative example.
Figure 3B:
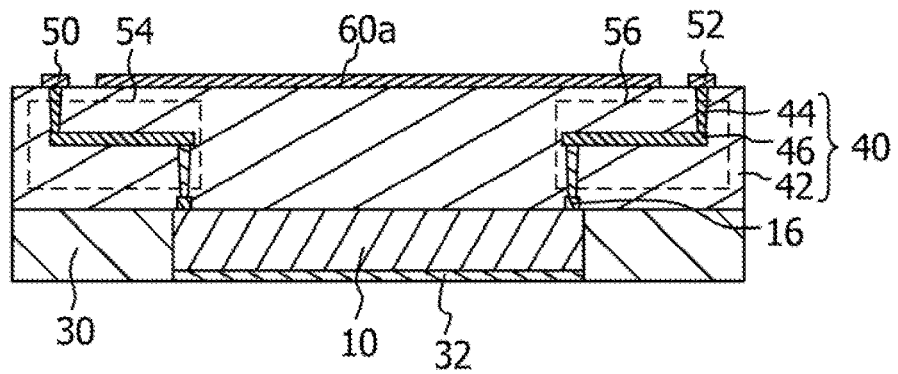
FIG. 3B is a cross-sectional view taken along line A-A in FIG. 3A.

FIG. 3A is a plan view illustrating an amplifier according to a first comparative example, and FIG. 3B is a cross-sectional view taken along line A-A in FIG. 3A. In FIG. 3A, a ground plate 60a is hatched for the sake of clarity of the drawing. As illustrated in FIGS. 3A and 3B, in an amplifier 500 of the first comparative example, the opening 62 is not provided on the ground plate 60a provided on the surface of the redistribution layer 40. That is, the ground plate 60a is provided immediately above the transistors 12 formed in the transistor areas 14a to 14c. Since other configurations are the same as those of the first embodiment, descriptions thereof will be omitted.

Here, an experiment in which amplification characteristics of the amplifier 500 of the first comparative example and the amplifier chip 10 in the bare chip state are evaluated will be described. In the amplifier 500 of the first comparative example used in the experiment, the resin layer 30 is formed of an epoxy resin containing a silica filler, and the thickness thereof was 100 μm. The insulating film 42 of the redistribution layer 40 is formed of resin, and the redistribution via 44 and the redistribution 46 are formed of copper. The thickness (i.e., thickness of the insulating film 42) of the redistribution layer 40 is 20 μm. The ground plate 60a is formed of copper, and the thickness thereof is 3 μm. In addition, the transistor 12 formed in the amplifier chip 10 is a high electron mobility transistor using gallium nitride.

Figure 4:
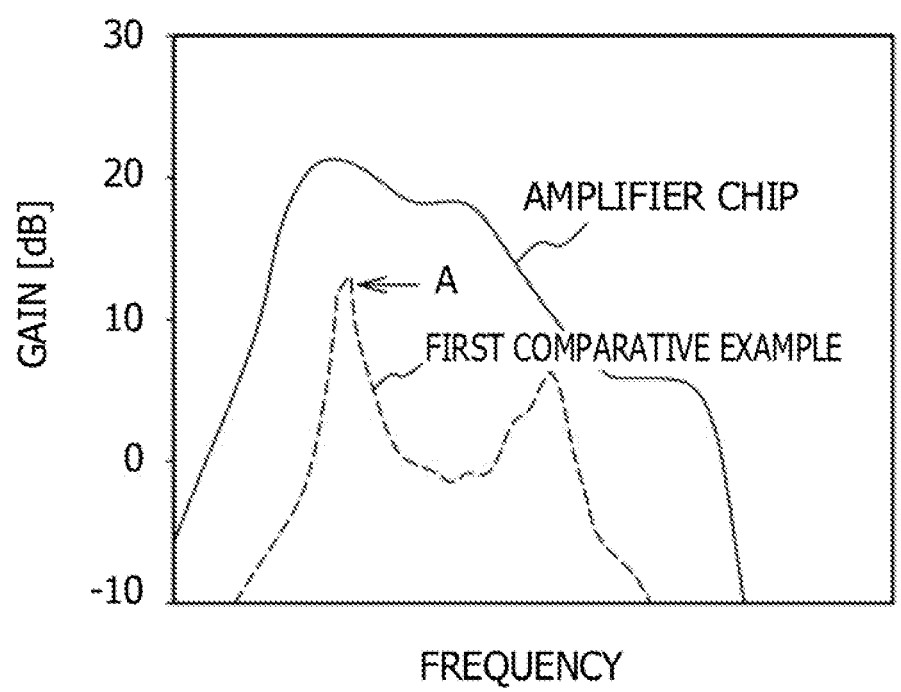
FIG. 4 illustrates experimental results of measurement of amplification characteristics of the amplifier according to the first comparative example and an amplifier chip in a bare chip state.

FIG. 4 illustrates experimental results of measurement of amplification characteristics of the amplifier according to the first comparative example and the amplifier chip in the bare chip state. The horizontal axis in FIG. 4 is the frequency of the input high-frequency signal. The vertical axis is the gain represented by the ratio of the output power to the input power of the high-frequency signal. The measurement results of the amplifier 500 of the first comparative example are illustrated by a broken line, and the measurement results of the amplifier chip 10 in the bare chip state are illustrated by a solid line.

As illustrated in FIG. 4, in the amplifier chip 10 in the bare chip state, a good amplification characteristic having a substantially constant gain in a predetermined frequency band is obtained. Meanwhile, in the amplifier 500 of the first comparative example, a peak of the gain is generated as indicated by an arrow A, and a good amplification characteristic is not obtained. As described above, the reason why the peak of the gain in the amplifier 500 of the first comparative example is generated may be considered as follows.

Figure 5:
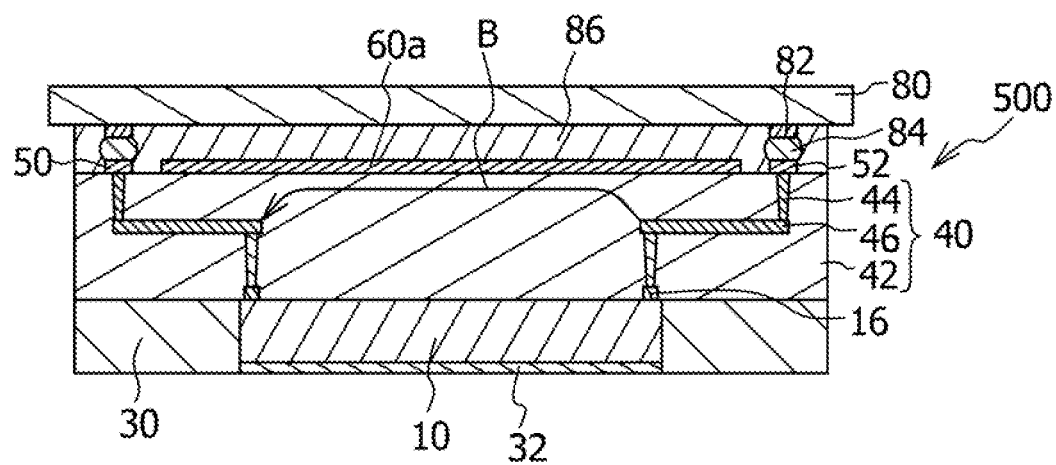
FIG. 5 is a view for explaining a problem occurred in the amplifier according to the first comparative example.

FIG. 5 is a view for explaining a problem occurred in the amplifier according to the first comparative example. As illustrated in FIG. 5, the amplifier 500 of the first comparative example is flip-chip mounted on a mounting substrate 80. That is, the amplifier 500 is flip-chip mounted on the mounting substrate 80 by bonding the input pad 50 and the output pad 52 of the amplifier 500 to a pad 82 of the mounting substrate 80 by solder 84. An underfill material 86 is filled between the mounting substrate 80 and the amplifier 500. In this case, the capacitive coupling between the mounting substrate 80 and the amplifier chip 10 may be suppressed by providing the ground plate 60a which is positioned above the amplifier chip 10 and overlaps with the amplifier chip 10. In addition, electrical interference between the underfill material 86 and the amplifier chip 10 may also be suppressed. As a result, change of the frequency characteristic of the gain of the amplifier chip 10 may be suppressed.

However, when the ground plate 60a is provided, a portion of the high-frequency signal output from the amplifier chip 10 may be propagated to the input side of the amplifier chip 10 through the ground plate 60a, as illustrated in an arrow B in FIG. 5. That is, a current flow from the output side of the amplifier chip 10 to the input side through the ground plate 60a may be occurred. When the frequency of the high-frequency signal which is fed back from the output side of the amplifier chip 10 to the input side through the ground plate 60a falls within the frequency band which is amplified by the amplifier chip 10, unnecessary oscillation due to the feedback occurs. Therefore, the arrow A in FIG. 4 may be considered as the oscillation due to the high-frequency signal which is fed back from the output side of the amplifier chip 10 to the input side through the ground plate 60a. In the amplifier 500 of the first comparative example, there is a portion where the gain is larger on the high-frequency side than the arrow A, but it may be considered that this is not oscillation. When unnecessary oscillation occurs, the operation of the amplifier chip 10 becomes unstable, so that it is difficult to obtain a good amplification characteristic.

Next, descriptions will be made on an experiment in which an amplification characteristic of the amplifier 100 of the first embodiment is evaluated. The material and the thickness of the resin layer 30, the redistribution layer 40, and the ground plate 60 of the amplifier 100 of the first embodiment used in the experiment are the same as those of the resin layer 30, the redistribution layer 40, and the ground plate 60a of the amplifier 500 of the first comparative example described above. In addition, the transistor 12 formed in the amplifier chip 10 is also a high electron mobility transistor using gallium nitride as in the amplifier 500 of the first comparative example. The opening 62 formed in the ground plate 60 has the length L of λ/2 in the second direction, and the width W of 20 μm in the first direction. As described above, λ is a wavelength at the lower limit frequency of the frequency band in which gain is obtained.

Figure 6:
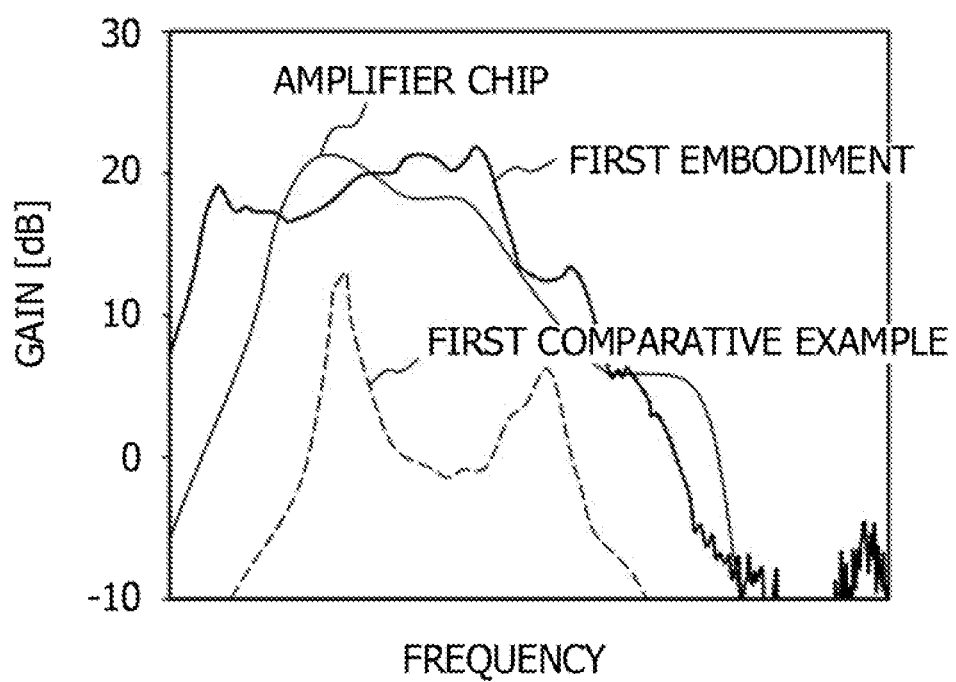
FIG. 6 illustrates experimental results of measurement of an amplification characteristic of the amplifier according to the first embodiment.

FIG. 6 illustrates experimental results of measurement of an amplification characteristic of the amplifier according to the first embodiment. The horizontal axis in FIG. 6 is the frequency of the input high-frequency signal. The vertical axis is the gain represented by the ratio of the output power to the input power of the high-frequency signal. In FIG. 6, the amplification characteristics of the amplifier 500 of the first comparative example and the amplifier chip 10 in the bare chip state illustrated in FIG. 4 are also illustrated for comparison. As illustrated in FIG. 6, in the amplifier chip 100 in the first embodiment, a good amplification characteristic having a substantially constant gain in a predetermined frequency band is obtained.

As illustrated in FIG. 6, the reason why a good amplification characteristic is obtained in the amplifier 100 of the first embodiment may be considered as follows. That is, in the amplifier 100 of the first embodiment, the ground plate 60 is provided with the opening 62, which extends in the second direction intersecting the first direction in which the high-frequency signal is propagated, at a position overlapped with the transistor 12. Therefore, the high-frequency signal fed back from the output side of the amplifier chip 10 to the ground plate 60 is propagated to the input side of the amplifier chip 10 by bypassing the opening 62. In addition, in the respective transistors 12, the high-frequency signal fed back from the output side to the input side through the ground plate 60 bypasses the opening 62. Therefore, the frequency of the high-frequency signal fed back is changed by the change of the electrical field accompanied by the bypass of the opening 62, and may be shifted to the frequency side lower than the frequency band amplified by the amplifier chip 10. As a result, even if a portion of the high-frequency signal is fed back through the ground plate 60, it is difficult to be amplified by the amplifier chip 10, and thus, an occurrence of unnecessary oscillation may be suppressed, Therefore, as illustrated in FIG. 6, it may be considered that a good amplification characteristic having a substantially constant gain in a predetermined frequency band is obtained in the amplifier chip 100 of the first embodiment.

According to the first embodiment, as illustrated in FIGS. 1A and 16, the ground plate 60 positioned above the amplifier chip 10 is provided on the insulating film 42 provided on the amplifier chip 10. As a result, since the capacitive coupling or the like occurred between the amplifier chip 10 and the mounting substrate may be suppressed when the amplifier 100 of the first embodiment is mounted on the mounting substrate, the frequency characteristic change of the gain of the amplifier chip 10 may be suppressed. In addition, the ground plate 60 is provided with the opening 62, which extends in the second direction intersecting, in the plane direction, with the first direction in which the high-frequency signal is propagated from the input pad 50 to the output pad 52, at a position overlapped with the transistor 12. As a result, since the high-frequency signal fed back through the ground plate 60 is fed back by bypassing the opening 62, the high-frequency signal is shifted to a frequency on the frequency side lower than the frequency band amplified by the amplifier chip 10. As a result, an occurrence of unnecessary oscillation is suppressed, and a good amplification characteristic may be obtained.

As illustrated in FIG. 1A, the length L of the opening 62 in the second direction may be larger than λ/2 (L>λ/2) where λ is a wavelength at the lower limit frequency of the frequency band in which gain is obtained by the amplifier 10. As a result, the frequency of the high-frequency signal fed back through the ground plate 60 may be efficiently shifted to the frequency side lower than the frequency band amplified by the amplifier chip 10.

As illustrated in FIGS. 1A and 16, the width W of the opening 62 in the first direction may be larger than the thickness T (the case where W>T) of the insulating film 42 from the surface of the amplifier chip 10 to the ground plate 60. The thickness T of the insulating film 42 is set, generally, to a distance at which capacitive coupling does not easily occur between the amplifier chip 10 and the underfill material 86 in FIG. 5. Therefore, when the width W of the opening 62 is set to be larger than the thickness T of the insulating film 42, the high-frequency signal fed back through the ground plate 60 may be suppressed from propagating over the opening 62. Therefore, the frequency of the high-frequency signal fed back through the ground plate 60 may be efficiently shifted to the frequency side lower than the frequency band amplified by the amplifier chip 10.

From the viewpoint of suppressing the high-frequency signal from propagating over the opening 62, the width W of the opening 62 may be larger than 1.2 times, further 1.5 times, and yet further 2 times the thickness T of the insulating film 42.

From the viewpoint of having high gain when the transistor 12 formed in the amplifier chip 10 is a field effect transistor using gallium nitride, oscillation occurs easily when the high-frequency signal is fed back. Therefore, when the transistor 12 is a field effect transistor using gallium nitride, it is desirable to use the ground plate 60 having the opening 62.

As described in the first comparative example, in the case of FOWLP including the resin layer 30 which covers the amplifier chip 10, the redistribution layer 40 provided on the amplifier chip 10 and the resin layer 30, capacitive coupling occurs easily between the mounting substrate and the amplifier chip 10. Therefore, it is desirable to provide the ground plate 60a on the insulating film 42. However, when the ground plate 60a which does not have the opening 62 is used, a good amplification characteristic may not be obtained. Therefore, similarly to the amplifier 100 of the first embodiment, in the case of the FOWLP amplifier including the amplifier chip 10, the resin layer 30, and the redistribution layer 40, it is desirable to use the ground plate 60 having the opening 62, in order to implement both the suppression of the capacitive coupling and the obtaining of the good amplification characteristic.

As illustrated in FIG. 1B, the input matching circuit 54 and the output matching circuit 56 that perform the impedance matching of the high-frequency signal amplified by the transistor 12 in the amplifier chip 10 may be formed in the redistribution layer 40. Therefore, the amplifier chip 10 may be miniaturized and the cost may be reduced.

In the first embodiment, the case where the insulating film 42 is provided on the amplifier chip 10 and the resin layer 30 to constitute the redistribution layer 40 is described as an example. However, the present disclosure is not limited thereto. For example, the resin layer 30 that covers the amplifier chip 10 may not be provided, and the insulating film 42 may be provided only on the amplifier chip 10.

Second Embodiment

Figure 7:
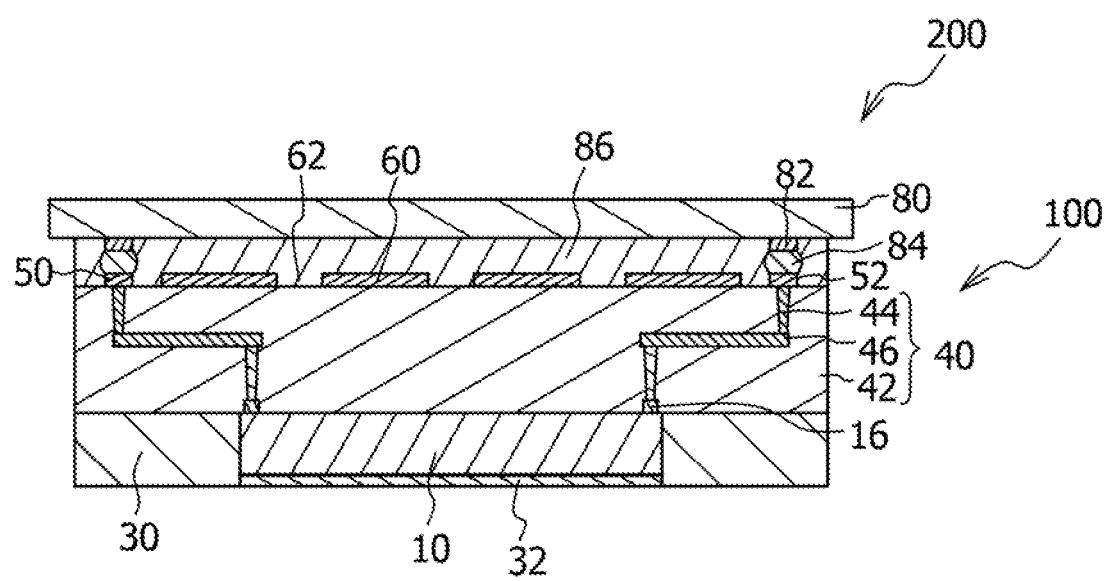
FIG. 7 is a cross-sectional view illustrating an amplification apparatus according to a second embodiment.

FIG. 7 is a cross-sectional view illustrating an amplification apparatus according to a second embodiment. As illustrated in FIG. 7, an amplification apparatus 200 of the second embodiment includes the mounting substrate 80, and the amplifier 100 of the first embodiment which is flip-chip mounted on the mounting substrate 80. The amplifier 100 is flip-chip mounted on the mounting substrate 80 by bonding the input pad 50 and the output pad 52 thereof to the pad 82 of the mounting substrate 80 by the solder 84. The underfill material 86 is filled between the mounting substrate 80 and the amplifier 100. The underfill material 86 is formed using, for example, an epoxy resin, and may contain a filler such as silicon oxide. The mounting substrate 80 may be an antenna substrate including one or a plurality of radiating elements on the surface which is an opposed side to the surface on which the amplifier 100 is mounted. For example, the amplification apparatus 200 of the second embodiment may be an amplification apparatus used in a fifth-generation mobile communication system. The mounting substrate 80 is formed, for example, by processing a substrate on which a glass epoxy resin and a metal foil in accordance with the flame retardant type 4 (FR-4) standard are laminated, or a substrate on which ceramic and a metal foil are laminated.

According to the amplification apparatus 200 of the second embodiment, the amplifier 100 of the first embodiment is flip-chip mounted on the mounting substrate 80. As a result, the capacitive coupling between the mounting substrate 80 and the amplifier chip 10 may be suppressed, and also the amplification apparatus 200 including the amplifier 100 having a good amplification characteristic may be obtained.

As illustrated in FIG. 7, the underfill material 86 is filled between the mounting substrate 80 and the amplifier 100. By filling the underfill material 86, reliability may be improved, for example, the peeling of the amplifier 100 from the mounting substrate 80 due to the stress caused by the thermal expansion coefficient difference may be suppressed. However, in the case where the underfill material 86 is filled, there is a concern that electrical interference occurs between the underfill material 86 and the amplifier chip 10, so that the frequency characteristic of the gain of the amplifier chip 10 is changed. However, since the ground plate 60 is provided above the amplifier chip 10, the electrical interference between the underfill material 86 and the amplifier chip 10 is suppressed, so that the change of the frequency characteristic of the gain of the amplifier chip 10 is suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier comprising:
   an amplifier circuit configured to include a transistor that amplifies a signal;
   an insulating film provided over the amplifier circuit;
   an input pad provided over the insulating film and coupled to the transistor through a wiring in the insulating film;
   an output pad provided over the insulating film and coupled to the transistor through the wiring in the insulating film; and
   a metal layer provided over the insulating film to be grounded, and configured to include an opening that extends in a second direction intersecting with a first direction in a plane direction, the signal propagating from the input pad to the output pad in the first direction, and the opening being at a position overlapping the transistor.

2. The amplifier according to claim 1, wherein a length of the opening in the second direction is larger than λ/2, wherein λ is a wavelength at a lower limit frequency of a frequency band in which a gain is obtained by the amplifier circuit.

3. The amplifier according to claim 1, wherein a width of the opening in the first direction is larger than a thickness of the insulating film from a surface of the amplifier circuit to the metal layer.

4. The amplifier according to claim 1, wherein a width of the opening in the second direction is longer than a width of the opening in the first direction.

5. The amplifier according to claim 1, wherein the amplifier circuit includes a plurality of transistor circuits, and one opening provided in the metal layer overlaps at least two or more of the plurality of transistors.

6. The amplifier according to claim 1, wherein the input pad, the output pad, and the metal layer are provided over a surface of the insulating film.

7. The amplifier according to claim 1, wherein the transistor is a field effect transistor using gallium nitride.

8. The amplifier according to claim 1, further comprising:
   a resin layer configured to surround the amplifier circuit,
   wherein the insulating film is provided over the amplifier circuit and the resin layer to constitute a redistribution layer.

9. The amplifier according to claim 8, wherein the redistribution layer includes an input matching circuit and an output matching circuit that perform an impedance matching of the signal.

10. An amplification apparatus comprising:
    an amplifier configured to include:
    an amplifier circuit configured to include a transistor that amplifies a signal,
    an insulating film provided over the amplifier circuit,
    an input pad provided over the insulating film and coupled to the transistor through a wiring in the insulating film,
    an output pad provided over the insulating film and coupled to the transistor through the wiring in the insulating film, and
    a metal layer provided over the insulating film to be grounded, and configured to include an opening that extends in a second direction intersecting with a first direction in a plane direction, the signal propagating from the input pad to the output pad in the first direction, and the opening being at a position overlapping the transistor; and
    a mounting substrate over which the amplifier is flip-chip mounted.

11. The amplification apparatus according to claim 10, further comprising:
    an underfill material filled between the mounting substrate and the amplifier.

* * * * *